(12) United States Patent
Chen

(10) Patent No.: US 7,960,252 B2
(45) Date of Patent: Jun. 14, 2011

(54) METHOD FOR FORMING A SEMICONDUCTOR FILM INCLUDING A FILM FORMING GAS AND DECOMPOSING GAS WHILE EMITTING A LASER SHEET

(76) Inventor: Yung-Tin Chen, Santa Clara, CA (US)

( * ) Notice: Subject to any disclaimer, the term of this patent is extended or adjusted under 35 U.S.C. 154(b) by 155 days.

(21) Appl. No.: 12/321,773

(22) Filed: Jan. 26, 2009

(65) Prior Publication Data

US 2010/0081260 A1 Apr. 1, 2010

Related U.S. Application Data

(63) Continuation-in-part of application No. 12/286,331, filed on Sep. 30, 2008.

(51) Int. Cl.
*H01L 21/20* (2006.01)
*H01L 21/36* (2006.01)

(52) U.S. Cl. .......................... 438/478; 438/485; 438/487

(58) Field of Classification Search .................. 438/478, 438/485, 487; 257/E21.09
See application file for complete search history.

(56) References Cited

U.S. PATENT DOCUMENTS

| | | | |
|---|---|---|---|
| 4,664,938 A | 5/1987 | Walker | |
| 4,919,077 A | 4/1990 | Oda et al. | |
| 4,986,214 A | 1/1991 | Zumoto et al. | |
| 5,025,135 A * | 6/1991 | Gesche et al. | 219/506 |
| 5,246,536 A * | 9/1993 | Nishizawa et al. | 117/102 |
| 6,248,216 B1 | 6/2001 | Bi et al. | |
| 7,674,394 B2 * | 3/2010 | Paterson et al. | 216/59 |
| 2006/0033935 A1 * | 2/2006 | Keightley et al. | 356/638 |

FOREIGN PATENT DOCUMENTS

JP 403055839 * 3/1991

OTHER PUBLICATIONS

Solanki, "Photodeposition of aluminum oxide and aluminum thin films," Applied Physics Letters, 1983, pp. 454-456, vol. 43, issue 5, AIP.

* cited by examiner

*Primary Examiner* — William M. Brewster
(74) *Attorney, Agent, or Firm* — Bing K. Yen; G. Marlin Knight

(57) ABSTRACT

An apparatus for high-rate chemical vapor (CVD) deposition of semiconductor films comprises a reaction chamber for receiving therein a substrate and a film forming gas, a gas inlet for introducing the film forming gas into the reaction chamber, an incidence window in the reaction chamber for transmission of a laser sheet into the reaction chamber, a laser disposed outside the reaction chamber for generating the laser sheet and an antenna disposed outside the reaction chamber for generating a plasma therein. The film forming gas in the chamber is excited and decomposed by the laser sheet, which passes in parallel with the substrate along a plane spaced apart therefrom, and concurrent ionization effected by the antenna, thereby forming a dense semiconductor film on the substrate at high rate.

20 Claims, 7 Drawing Sheets

METHOD FOR FORMING A SEMICONDUCTOR FILM INCLUDING A FILM FORMING GAS AND DECOMPOSING GAS WHILE EMITTING A LASER SHEET

RELATED APPLICATIONS

The present application is a continuation-in-part application of U.S. patent application Ser. No. 12/286,331, filed Sep. 30, 2008, for APPARATUS FOR HIGH-RATE CHEMICAL VAPOR DEPOSITION, by Yung-Tin Chen, included by reference herein and for which benefit of the priority date is hereby claimed.

BACKGROUND

1. Field of Invention

The present invention relates to a method for depositing semiconductor films, and more particularly to a chemical vapor deposition (CVD) process utilizing plasma and laser excitation means for high-throughput manufacturing of solar cells devices.

2. Description of Prior Art

Hydrogenated amorphous silicon (a-Si:H) and nano-crystalline silicon (nc-Si:H) are widely used in thin film solar cells because they can be fabricated over large area substrates as required by photovoltaic applications. Compared with amorphous Si, nc-Si:H may produce solar cells with higher efficiency and is more stable against light induced degradation or the Staebler-Wronski effect. Because of its lower absorption coefficient in the visible range of the solar spectrum, however, the nc-Si:H layer in solar cells needs to be 1 to 3 um thick, which is 3 to 10 times thicker than that required of a-Si:H.

Among various methods to form Si thin films over large area substrates, plasma-enhanced chemical vapor deposition (PECVD) which utilizes a capacitively coupled radio frequency (RF) discharge is widely used to form a-Si:H and nc-Si:H in the production of solar cells and thin film transistor (TFT) devices. While a-Si:H based solar cells and TFT devices have been commercially produced by PECVD for years, the production of thicker nc-Si:H films by PECVD is limited by the deposition rate thereof. The film forming rate in the PECVD process may be increased by increasing the RF power input, which increases the number of ionized film forming gas molecules and the energy thereof. As the film forming rate of nc-Si:H is increased by increasing the RF power input, however, the bombardment of the growing nc-Si:H film on the substrate by highly energized ions also increases, thereby generating film structural defects that have deleterious effects on electrical properties thereof. Accordingly, the forming rate of nc-Si:H film by PECVD only reaches approximately 0.5 nm/s in practice (Rosechek et al. Mat. Res. Soc. Symp. Vol 644 (2001)).

To overcome the problems associated with the use of PECVD for forming Si films, a laser-enhanced chemical vapor deposition (CVD) process that utilizes optical energy to decompose the film forming gas has been disclosed, for instance, in Applied Physics Letters, Vol 43, No. 5, pp 454-456. According to this process, the film forming gas resulting from the vapor phase decomposition by photo excitation does not accelerate and bombard the growing film on the substrate. It is therefore possible to form films at high rates with substantially no ion-induced damages at low temperatures.

FIG. 1 is a schematic view of a conventional laser beam CVD apparatus, which comprises a reaction chamber 20; a substrate 22 on which a film is formed; a suceptor 24 incorporating therein a heater for heating the substrate 22; an inlet port 26 for introducing a film forming gas such as silane; an output port 28 for discharging the post-reaction film forming gas; an ultraviolet (UV) laser oscillator 30 disposed outside the reaction chamber 20; an optical system 32 for reducing the diameter of the laser beam emitted from the UV laser oscillator 30; a beam incidence window 34 for transmitting the laser beam which emerged from the optical system 32 into the reaction chamber 20; a laser beam 36 emitted by the laser oscillator 30 for exciting and decomposing the film forming gas; a beam emergence window 38 for transmitting the laser beam 36 out of the reaction chamber 20; and a damper or trap 40 for absorbing the laser beam which has passed through the emergence window 38.

In this apparatus, when the silane gas is introduced from the inlet port 26 into the reaction chamber 20, the silane gas is excited and decomposed by the laser beam 36, which passes in parallel with the substrate 22 along a path spaced apart therefrom by a few millimeters. The reaction product from excitation and decomposition of the silane gas diffuses from the path of the laser beam 36 and deposits over the surface of the substrate 22, thereby forming a silicon film thereon. The post-reaction gas is discharged through the output port 28.

It is possible to form semiconductor films at high rates and low temperatures with the conventional laser beam CVD apparatus described above. However, there are several drawbacks in applying the conventional laser beam CVD process in production of solar cells and TFT devices, which requires dense and uniform semiconductor films deposited over large area substrates.

A problem associated with the conventional laser CVD process described above is that since the reaction product reaches the substrate surface by diffusing away from the laser effected zone, which is defined by the narrow path of the laser beam above the substrate, the concentration of the reaction product on the substrate surface will depend on the distance away from the path of the laser beam, thereby causing the film thickness on the substrate to vary in the direction perpendicular to the path of the laser beam. While it is possible to improve the film uniformity on the substrate by increasing the distance between the beam path and the substrate surface, doing so will adversely decrease the film deposition rate.

Another problem associated with the conventional laser beam CVD process described above is that under high-rate deposition conditions, there is a propensity for the formation of nanoparticles from the gas phase reaction, thereby causing nanoparticles to directly deposit on the substrate surface (for instance, see U.S. Pat. No. 6,248,216 B1). A film composed of aggregates of nanoparticles is inherently porous and has poor adhesion with the substrate compared with a monolithic film formed by condensation of reactant atoms or molecules on the substrate surface, such as films formed by the plasma CVD process. Porosity in semiconductor films can cause oxidation, which would adversely affect the electrical properties thereof, and other reliability problems.

U.S. Pat. No. 4,986,214 issued to Zumoto et al. discloses a laser beam CVD apparatus for forming diamond films. This apparatus includes an ion beam source which irradiates the growing diamond film surface with energetic ions from a non-film forming gas to improve film qualities. While bombardment of growing film by energetic ions may reduce film porosity, it will damage semiconductor films and have deleterious effects on electrical properties thereof as encountered in the PECVD process under high-rate deposition conditions.

Still another problem associated with the conventional laser CVD process described above is the clouding of the window surface inside the reaction chamber because film deposition occurs simultaneously on the surface of the window as the laser beam passes therethrough during the deposition on the substrate. The laser-induced reactions and the film deposition process on the substrate eventually terminate as the reaction product on the window forms an opaque layer so thick that the laser beam cannot effectively pass therethrough.

SUMMARY

The present invention is made to overcome the above and other problems encountered in the conventional laser CVD apparatus for high-throughput manufacturing of solar cells and thin-film transistor (TFT) devices.

Accordingly, an object of the present invention is to provide a CVD apparatus which is capable of forming a semiconductor film uniformly over a large area substrate by utilizing a laser sheet passes atop of the substrate to excite and decompose a film forming gas.

Another object of the present invention is to provide a CVD apparatus which is capable of forming a dense semiconductor film under high-rate deposition conditions without damaging the same by simultaneously utilizing a laser sheet and a plasma to excite and decompose a film forming gas.

Still another object of present invention is to provide a CVD apparatus in which the laser transmission window remains substantially free of film product during film forming process on a substrate by a means for removing the film forming gas from the surface of the laser transmission window.

Therefore, according to one aspect of the present invention, a CVD apparatus comprises a reaction chamber for receiving therein a substrate and a thin film forming gas, a gas inlet for introducing the thin film forming gas into the reaction chamber, an incidence window attached to a purge port in the reaction chamber for transmission of a laser sheet into the reaction chamber, a laser disposed outside the reaction chamber for generating the laser sheet, an antenna disposed outside the reaction chamber for generating a plasma therein and a bias electrode electrically connected to the substrate for attracting ions in the plasma to the substrate surface.

According to the present invention, the film forming gas in the chamber is excited and decomposed by the laser sheet, which passes in parallel with the substrate along a plane spaced apart therefrom, and concurrent ionization effected by the antenna, thereby forming a dense and uniform semiconductor film on the substrate at high rate. Moreover, during the film forming process on the substrate, the film forming gas in the reaction chamber is prevented from reaching the surface of the laser incidence window by flowing an inert gas through the purge port, to which the window is mounted.

To achieve the above and other objects, according to another aspect of the present invention, a CVD apparatus comprises a reaction chamber for receiving therein a substrate and a film forming gas, a gas shower head for introducing the film forming gas into the reaction chamber, an incidence window attached to a purge port in the reaction chamber for transmission of a laser sheet into the reaction chamber, a laser disposed outside the reaction chamber for generating the laser sheet, a discharge electrode arranged on top of the substrate in the chamber for generating a plasma therein, a ground electrode disposed in the reaction chamber opposite the discharge electrode and is electrically connected to the substrate, and an excimer laser disposed outside the chamber for irradiating the as-deposited film on the substrate with a laser beam, thereby further crystallizing the as-deposited film.

According to the present invention, the film forming gas in the chamber is excited and decomposed by the laser sheet, which passes between the discharge electrode and the substrate in parallel with the substrate along a plane spaced apart therefrom, and concurrent ionization effected by the electrodes, thereby forming a dense and uniform semiconductor film on the substrate at high rate. The as-deposited film is then irradiated by the laser beam generated by the excimer laser, thereby changing the film crystallinity and increasing the film grain size.

The objects, features, aspects, and advantages of the present invention are readily apparent from the following detailed description of the preferred embodiments for carrying out the invention when taken in connection with the accompanying drawings.

BRIEF DESCRIPTION OF THE DRAWINGS

For purposes of clarity and brevity, like elements and components will bear the same designations and numbering throughout the Figures.

DETAILED DESCRIPTION

Figure 1:
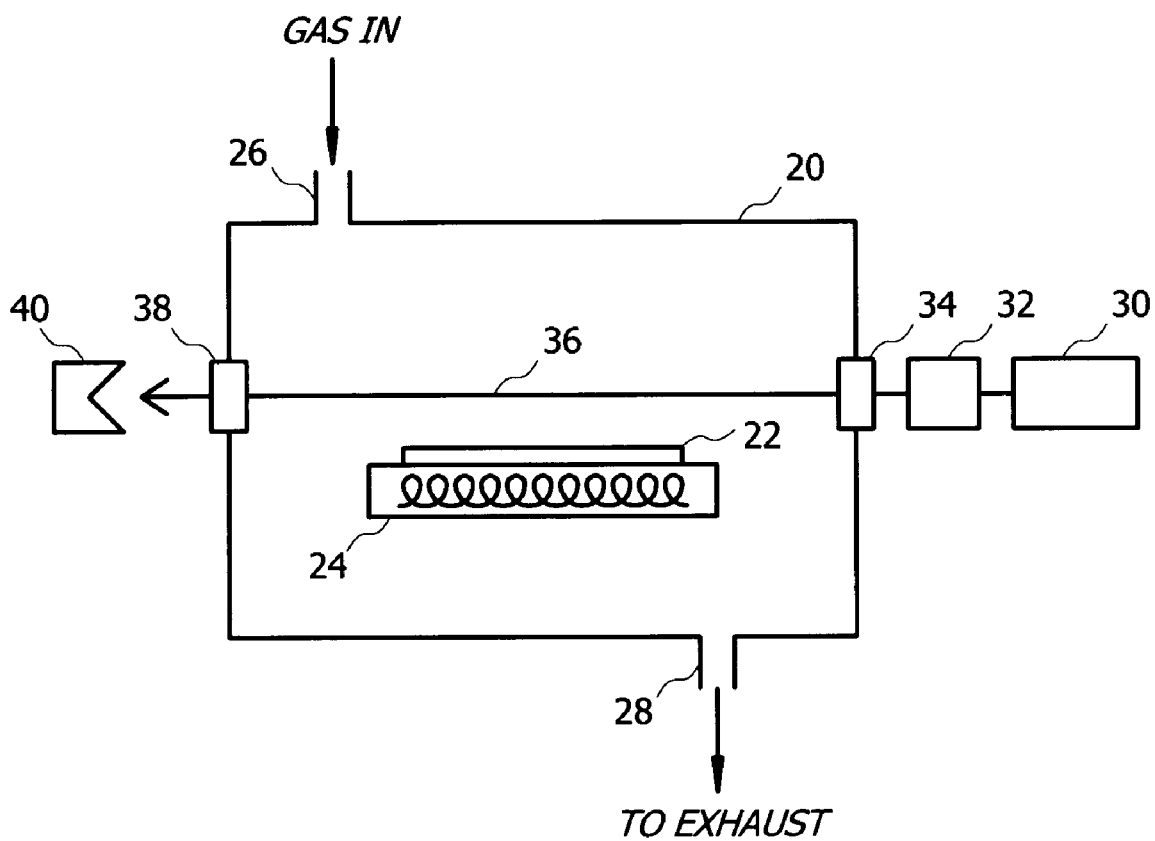
FIG. 1 is a schematic view showing the arrangement of a conventional laser beam CVD apparatus.
Figure 2:
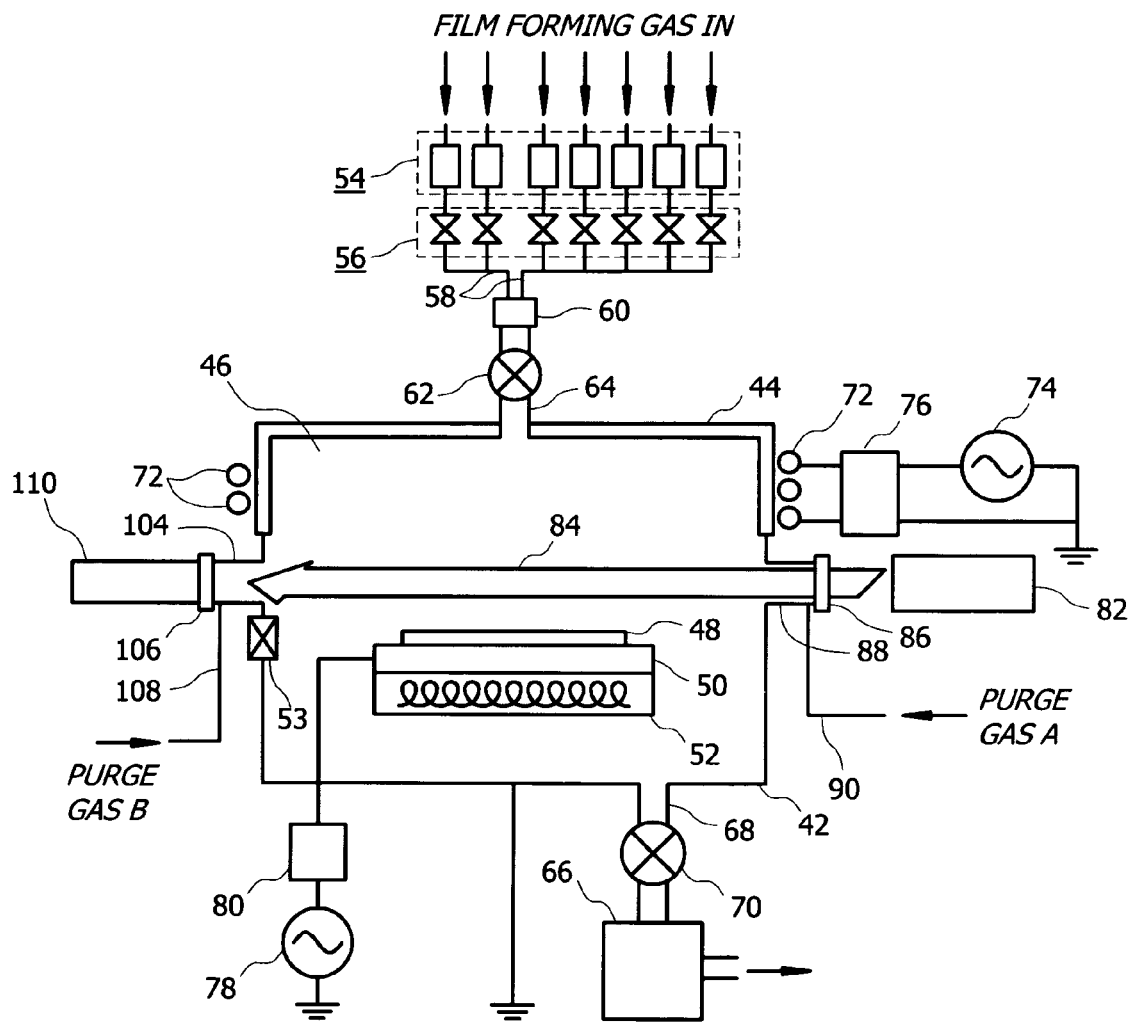
FIG. 2 is a schematic view of a high-rate CVD apparatus in accordance with a first embodiment of the present invention.

The first embodiment of the present invention as applied to a high-rate chemical vapor deposition (CVD) apparatus for forming semiconductor thin films will now be described with reference to FIG. 2. Referring now to FIG. 2, the illustrated apparatus has a vessel base 42, preferably constructed of a suitably strong and conductive material such as stainless steel and is electrically grounded, and a vessel top or dome 44, which is made of a dielectric material such as aluminum oxide or aluminum nitride. The base 42 and the dome 44 combined to define a reaction chamber 46 therein.

A generally flat substrate 48 for coating a film thereon is placed inside the reaction chamber 46. The substrate 48 is supported by a mounting base 50, which also serves as a bias electrode. A suceptor 52 for heating the substrate 48 is attached to the bottom surface of the mounting base 50, and incorporates therein a heating element which may be energized from a current source (not shown) external to the chamber 46. The substrate 48 is transported in and out of the chamber 46 through a shutter 53 disposed on the sidewall of the vessel base 42.

Gases from a plurality of external gas sources for forming semiconductor films, such as monosilane ($SiH_4$), germane ($GeH_4$), methane ($CH_4$), propane ($C_3H_8$), hydrogen ($H_2$), diborane ($B_2H_6$), and phosphine ($PH_3$), are controlled by a set of corresponding mass flow controllers (MFCs) 54 and control valves 56 and pass through gas delivery lines 58 (only some of which are shown) to a gas mixer 60. The resulting film forming gas in the mixer 60 passes through an inlet valve 62 and is introduced into the chamber 46 via a gas inlet port 64 which extends through the top wall of the vessel dome 44. The post-reaction gas in the chamber 46 is removed by a pumping system 66 through an output port 68, which is connected to a throttling valve 70 for controlling the chamber pressure.

As would be understood by a person of skill in the art, the actual film forming gas used and the actual connection of delivery lines 58 to the gas mixer 60 may vary depending on the desired film forming reaction in the chamber 46. For example, a silicon-contained gas, such as monosilane ($SiH_4$), disilane ($Si_2H_6$), trisliane ($Si_3H_8$), silicon tetrafluoride ($SiF_4$), silicon tetrachloride ($SiCl_4$), monomethylsilane ($SiH_3CH_3$), hexamethyldisilane ($Si_2(CH_3)_6$), dichlorosilane ($H_2SiCl_2$) or trichlorosilane ($HSiCl_3$), may be used to form an a-Si:H, nc-Si:H, or polycrystalline Si film. In addition to the above Si-contained gas, hydrogen ($H_2$) gas may be added thereto for suppressing defect formation in the Si film. A semiconductor film containing Si and carbon (C) may be formed by using a mixture of the above Si-contained gas and a C-contained gas, such as methane ($CH_4$), acetylene ($C_2H_2$), ethylene ($C_2H_4$), ethane ($C_2H_6$), propylene ($C_3H_6$) or propane ($C_3H_8$). A semiconductor film containing Si and germanium (Ge) may be produced by using a mixture of the above Si-contained gas and a Ge-contained gas, such as germane ($GeH_4$), monomethylgermane ($GeH_3CH_3$) or dimethylgemane ($GeH_2(CH_3)_2$). A semiconductor film containing Si, Ge and C may be formed by using a mixture of the above Si-contained gas, the above Ge-contained gas and the above C-contained gas. For forming a p-type or n-type semiconductor film, an additional dopant gas, such as diborane ($B_2H_2$), trimethylborane ($B(CH_3)_3$), phosphine ($PH_3$) or phosphorus trichloride ($PCl_3$), is introduced into the mixer 60 via a delivery line separate from delivery lines for above-mentioned Si, Ge and C-contained film forming gases.

An antenna 72 which is formed in a helical coil is disposed in close proximity to the outer sidewall of the dome vessel 44 for inducing a high frequency electric field in the reaction chamber 46, thereby generating a gaseous plasma by ionization of the forming gas in the same. A radio frequency (RF) power supply 74, preferably having an excitation frequency of 1 to 108.48 MHz, provides energy to the antenna 72 through an impedance matching network 76, which matches the output impedance of the RF power supply 74 with the antenna 72 in a manner as well known to one of skill in the art.

A planar bias electrode 50, which also serves as the mounting base for supporting the substrate 48, is used to enhance the transport of plasma species (e.g., ions) generated by the antenna 72 to the surface of the substrate 48. The electrically grounded vessel base 42 serves as the complimentary electrode to the bias electrode 50. A RF power supply 78, preferably having an excitation frequency of 13.56 MHz or lower, provides power to the bias electrode 50 via a bias matching network 80.

A high-power carbon dioxide ($CO_2$) laser source 82 disposed outside the reaction chamber 46 is used to emit a laser sheet 84 for exciting and decomposing the film forming gas in the chamber 46. Other types of gas lasers such as excimer laser, argon fluoride (ArF) laser, krypton chloride (KrCl) laser, krypton fluoride (KrF) laser, xenon chloride (XeCl) laser and xenon fluoride (XeF) laser may also be used to emit the laser sheet 84. The laser sheet 84 is transmitted into the reaction chamber 46 through a laser incidence window 86 attached to a laser incidence port 88, which is disposed on the side of the vessel base 42. The incidence window 86 is constructed of a suitably rigid and light-transparent material such as quartz. A purge gas A, preferably an inert gas such as Ar, helium (He), xenon (Xe) or krypton (Kr), is introduced into the cavity of the incidence port 88 via a purge gas delivery line 90, thereby removing the film forming gas therein and preventing the clouding of the laser incidence window 86 attached thereto. The cavity opening of the incidence port 88 to the reaction chamber 46 in the direction perpendicular to the laser sheet 84 should be sufficiently narrow, preferably less than 5 mm, and the length of the cavity of the incidence port 88 in the propagation direction of the laser sheet 84 should be sufficiently long, preferably longer than 100 mm, thereby preventing the film forming gas in the reaction chamber 46 from reaching the surface of the incidence window 86 by diffusion.

Figure 3A:
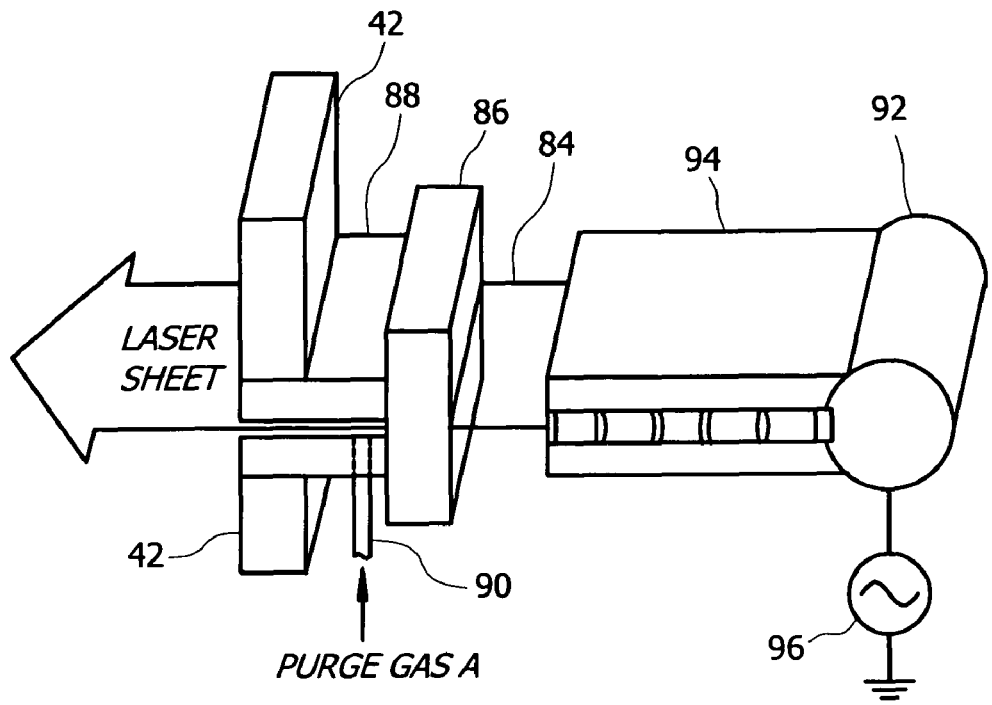
FIG. 3A and FIG. 3B are schematic views showing examples of laser sources which generate a laser sheet according to the CVD apparatus in FIG. 2.
Figure 3B:
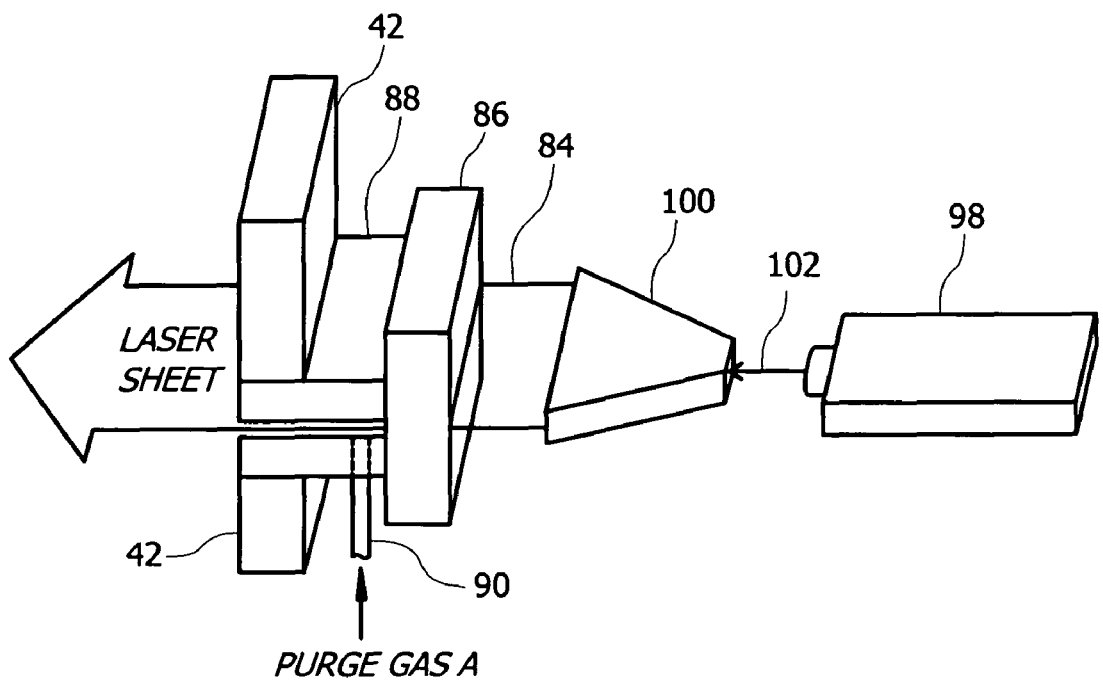

The above laser source 82 may be constructed according to FIGS. 3A and 3B for generating the laser sheet 84. In the drawings, numerals 42 and 84 to 90 denote the same components or substances as those shown in FIG. 2. FIG. 3A is a schematic illustration showing a laser source, which includes a cylindrical laser chamber 92 for containing a gain medium therein, an optical system 94 connected thereto, and an external RF power source 96 for providing energy to the gain medium therein. The optical system 94 includes a plurality of optical lenses, which have cross sections that are substantially constant along the axis of the cylindrical laser chamber 92. When power is supplied to the laser chamber 92, the gain medium therein emits an electromagnetic wave (e.g. light) which propagates through the set of optical lenses in the optical system 94 to form the laser sheet 84, which passes through the incidence window 86 and into the reaction chamber through the incidence port 88. FIG. 3B is a schematic illustration showing another laser source for generating the laser sheet 84, which includes a conventional beam-type laser source 98 and an optical system 100 which shapes a laser beam 102 generated from the conventional laser source 98 to the laser sheet 84.

Referring again to FIG. 2, the laser sheet 84 passes inside the chamber 46 on a plane which is substantially parallel to the top surface of the substrate 48 and is spaced apart therefrom by a few millimeters. The laser sheet 84 should be wider than the substrate 48 in the direction orthogonal to the propagation direction of the same, thereby allowing excitation and decomposition of the film forming gas to occur uniformly over the substrate 48. The laser sheet 84 exits the chamber 46 through a laser emergence port 104 disposed on the vessel base 42 opposite to the incidence port 86 and a transparent laser emergence window 106 attached thereto. A purge gas B, preferably an inert gas such as Ar, He, Xe or Kr, is introduced into the cavity of the emergence port 104 via a purge gas delivery line 108, thereby removing the film forming gas therein and preventing the clouding of the laser emergence window 106 attached thereto. A laser termination unit 110 is attached to the laser emergence window 106 for receiving the laser sheet 84 emerged from the same. The termination unit 110 includes a power detector (not shown) for measuring the amount of photon energy absorbed by the film forming gas and a plurality of optical lenses and reflective mirrors (not shown) for reflecting the laser sheet 84 back to the reaction chamber 46, thereby further enhancing the excitation and decomposition of the film forming gas therein. The above-mentioned laser termination unit 110 may also be replaced by a laser trap made from a light absorbing material such as carbon for absorbing the laser sheet 84 which has emerged from the emergence window 106.

Operation of the illustrated apparatus of FIG. 2 will now be described for forming a nc-Si:H semiconductor film on a substrate. The reaction chamber 46 is first evacuated to $10^{-6}$-

$10^{-8}$ Torr by the pumping system 66. With the substrate 48 placed on the mounting base 50 in the reaction chamber 46, the suceptor 52 is used to heat the substrate 48 to 150-550° C., preferably 300-500° C. When the desired substrate temperature is reached, a film forming gas containing a mixture of $SiH_4$ and $H_2$ is introduced at a predetermined flow rate into the reaction chamber 46 through the gas inlet port 64. The ratio of $H_2$ to $SiH_4$ in the film forming gas is greater than 10:1, preferably about 15:1. The pressure of the film forming gas in the chamber 46 is maintained at $10^{-2}$ to 1 Torr, preferably $10^{-2}$ to $10^{-1}$ Torr. The high frequency power is then provided to the coil-shaped antenna 72 and the bias electrode 50 by the antenna power supply 74 and the bias electrode power supply 78, respectively, and at the same time a laser sheet 84 is emitted from the laser source 82 into the reaction chamber 46.

The film forming gas in the reaction chamber 46 is converted into a gaseous plasma state upon excitation by the high frequency electric field exerted by the antenna 72. The excited species formed in the plasma, which include ions and partially decomposed molecules, reach the top of the substrate 48 and condense thereon to form a dense nc-Si:H film. The plasma power density is set to be 0.01-3 W/cm$^3$, preferably 0.02-1 W/cm$^3$. The plasma power density is a value of the power applied from the antenna power supply 74 to the antenna 72 for plasma generation divided by the volume of plasma generation region in the reaction chamber 46, which approximately corresponds to the cylindrical volume defined by the coil-shaped antenna 72.

The ions in the plasma are accelerated toward the substrate 48 by the electric field exerted by the bias electrode 50, thereby compacting the growing nc-Si:H film. The bias voltage on the electrode 50 is applied by the RF power supply 78 in such a way that ions transported to the substrate surface would have energies less than a predetermined threshold energy (for instance, 16 eV for Si), beyond which the semiconductor film on the substrate 48 may be damaged by bombardment from high energy ions.

With the $H_2$ and $SiH_4$ gas mixture in the reaction chamber 46 being converted into a gaseous plasma state by the antenna 72, the laser sheet 84 which passes atop of the substrate 48 concurrently excites and decomposes $SiH_4$ gas molecules along its path in the chamber 46. Under high-rate deposition conditions, such as high laser power and high $SiH_4$ gas flow rate, exothermic reactions may occur to form discrete nc-Si:H nanoparticles in the gas phase, thereby depositing the same directly on the substrate 48. The simultaneous deposition of discrete nc-Si:H nanoparticles on the substrate 48 by the laser-induced reactions and condensed vapors from the plasma allows the condensation of the excited species in the plasma to fill the gaps between nc-Si:H nanoparticles, thereby forming a non-porous nc-Si:H film with nanoparticles imbedded in a dense matrix. The film forming process is carried out until a desired nc-Si:H thickness of 1-30 µm is reached.

The above-described film forming process for nc-Si:H can also be used to form an a-Si:H semiconductor film on a substrate. In the case of a-Si:H film formation, the $H_2:SiH_4$ ratio in the film forming gas is less than 10:1 and the substrate temperature is set to be 50-300° C., preferably 100-200° C.

By use of the above-described film forming process and a film forming gas containing $SiH_4$, $H_2$ and $GeH_4$, amorphous SiGe (a-SiGe:H) semiconductor film and nano-crystalline SiGe (nc-SiGe:H) semiconductor film could be formed at substrate temperatures of 100-300° C. and 300-600° C., respectively.

By use of the above-described film forming process and a film forming gas containing $SiH_4$, $H_2$ and $CH_4$, amorphous SiC (a-SiC:H) semiconductor film and nano-crystalline SiC (nc-SiC:H) semiconductor film could be formed at substrate temperatures of 100-300° C. and 300-600° C., respectively.

By alternately introducing a film forming gas containing $SiH_4$, $H_2$ and $CH_4$ and another film forming gas containing $SiH_4$, $H_2$ and $GeH_4$ into the reaction chamber 46, a semiconductor film comprising a plurality of SiC/SiGe bilayers could be formed according to the above-described process.

Figure 4:
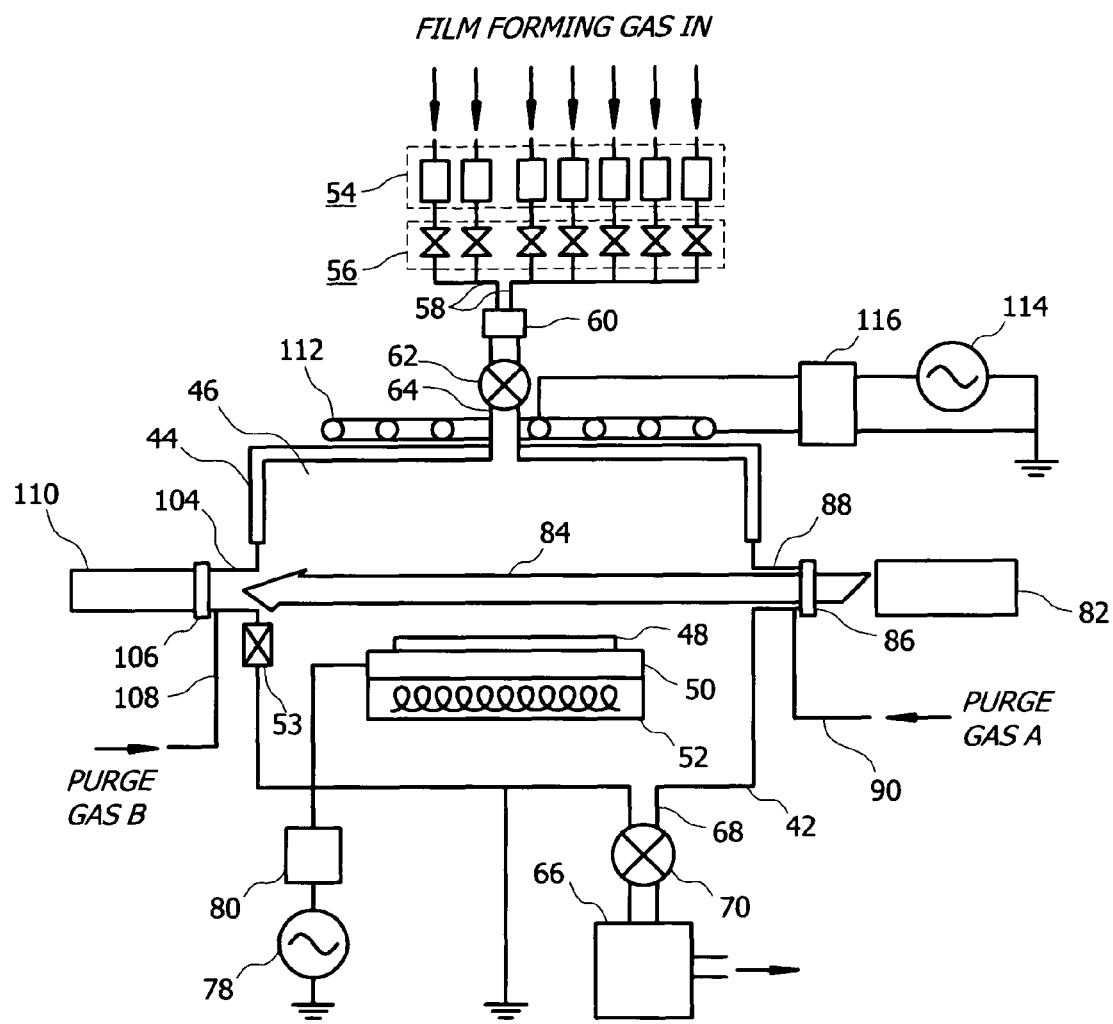
FIG. 4 is a schematic view of a high-rate CVD apparatus in accordance with a second embodiment of the present invention.

FIG. 4 is a schematic view showing a high-rate CVD apparatus for forming semiconductor films according to the second embodiment of the present invention. In the drawing, numerals 42 to 110 denote the same components or substances as those shown for the first embodiment in FIG. 2. The CVD apparatus of the second embodiment shown in FIG. 4 is different from the CVD apparatus of the first embodiment in that the helical antenna 72 in FIG. 2 is replaced by an antenna 112 with a planar spiral shape, which is disposed in close proximity to the top of the vessel dome 44 for inducing a high frequency electric field in the reaction chamber 46, thereby generating a gaseous plasma in the same. A RF power supply 114, preferably having an operating frequency of 1 to 108.48 MHz, provides energy to the antenna 112 through an impedance matching network 116.

The operation of the apparatus in FIG. 4 is similar to that of the apparatus of the first embodiment described above except that the placement of the spiral antenna 112 on top of the dome 44 in this embodiment results in a more uniform distribution of plasma over a plane parallel to that of the substrate surface, thereby forming a more uniform film layer over a large area substrate.

Figure 5:
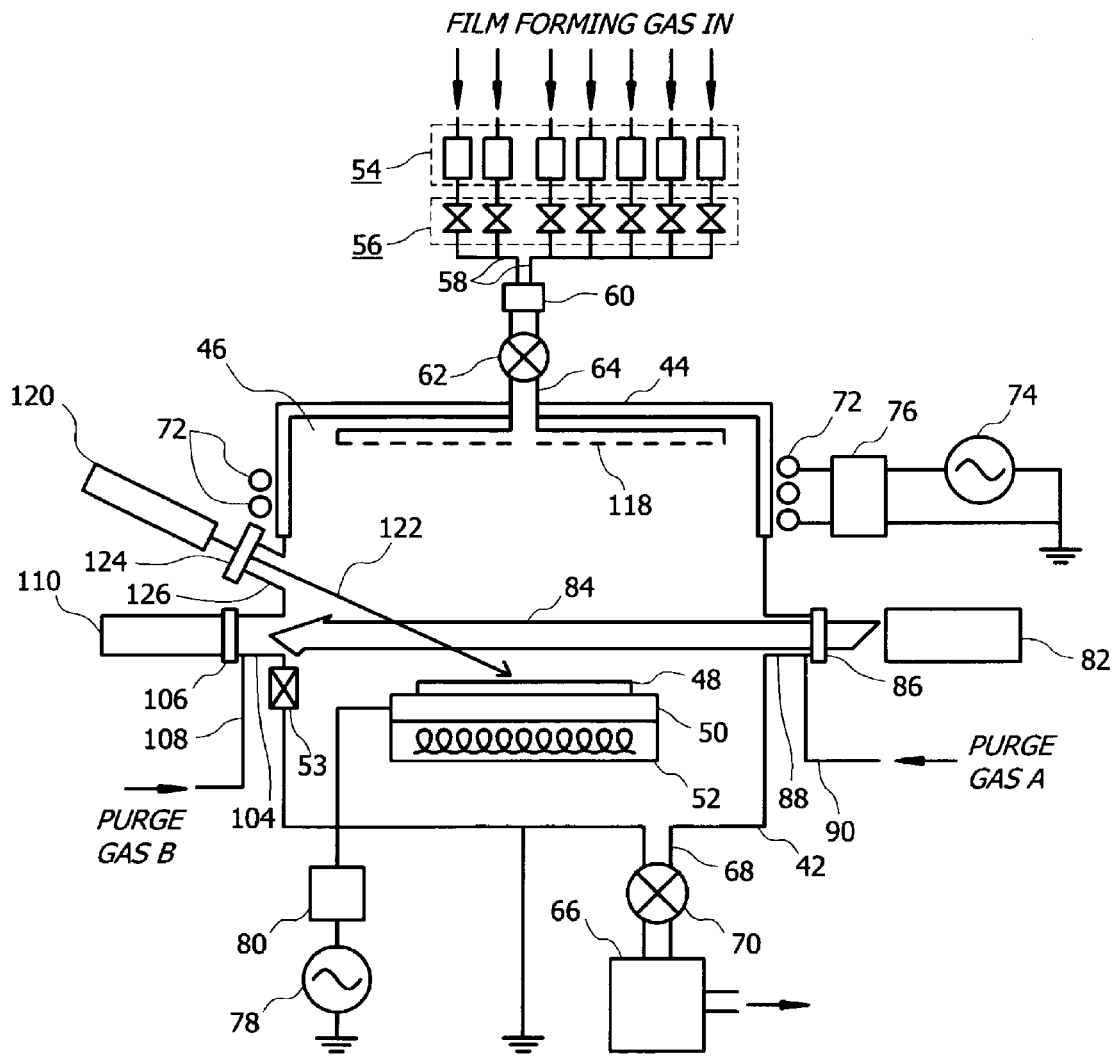
FIG. 5 is a schematic view of a high-rate CVD apparatus in accordance with a third embodiment of the present invention.

FIG. 5 is a schematic view showing a high-rate CVD apparatus for forming semiconductor films according to the third embodiment of the present invention. In the drawing, numerals 42 to 110 denote the same components or substances as those shown for the first embodiment in FIG. 2. The CVD apparatus of the third embodiment shown in FIG. 5 is different from the CVD apparatus of the first embodiment in that a gas shower head 118 is attached to the inlet port 64 for introducing the film forming gas into the chamber 46, and an excimer laser source 120 is disposed outside the chamber 46 for crystallizing a film by irradiating the same on the substrate 48 with a laser beam 122. The gas shower head 118 has a plurality of holes or openings distributed over the bottom surface thereof, such that the film forming gas passes therethrough is uniformly distributed in the chamber 46. The laser beam 122 emitted by the excimer laser source 120 passes into the reaction chamber 46 through a light-transparent window 124, which is attached to a peripheral port 126 on the vessel base 42. The excimer laser source 120 is positioned in such a way that permits the laser beam 122 to irradiate the top surface of the substrate 48 in the chamber 46.

The operation of the apparatus in FIG. 5 is similar to that of the apparatus of FIG. 2 described above except that the film forming gas is introduced into the reaction chamber 46 through the gas shower head 118 and the laser beam 122 is used to irradiate the film on the substrate 48 during or after film forming process. In the latter case, after a semiconductor film is formed according to the procedures described above for the operation of the apparatus of FIG. 2, all power to the antenna 72, the bias electrode 78 and the $CO_2$ laser 82 is terminated. The inlet gas valve 62 is closed and the film forming gas in the chamber 46 is evacuated by the pumping system 66, thereby forming a vacuum therein. Under the above state, power is provided to the excimer laser source 120 for generating the laser beam 122 with power density of 1-15 mW/cm$^2$ to irradiate the as-deposited film on top of the substrate 48, thereby changing the crystallinity and increasing the grain size thereof. For example, an a-Si:H film may be converted to a nc-Si:H or polysilicon film by such a laser-induced annealing process.

Alternately, the excimer laser source 120 may be used to irradiate the substrate surface with the laser beam 122 to decompose film forming molecules adsorbed on the substrate surface during film forming process. In the following example, forming of a nc-SiCGe:H semiconductor film utilizing the apparatus of FIG. 5 with the excimer laser source 120 will be described. The reaction chamber 46 is first evacuated to $10^{-6}$-$10^{-8}$ Torr by the pumping system 66. With the substrate 48 placed on the mounting base 50 in the reaction chamber 46, the suceptor 52 is used to heat the substrate 48 to 150-550° C., preferably 300-500° C. When the desired substrate temperature is reached, a film forming gas comprising a mixture of $SiH_4$, $CH_4$, $GeH_4$ and $H_2$ is introduced at a predetermined flow rate into the reaction chamber 46 through the gas shower head 118. The pressure of the film forming gas in the chamber 46 is maintained at $10^{-2}$ to 1 Torr, preferably $10^{-2}$ to $10^{-1}$ Torr. The high frequency power is then provided to the coil-shaped antenna 72 and the bias electrode 50 by the antenna power supply 74 and the bias electrode power supply 78, respectively, and at the same time a laser sheet 84 is emitted from the $CO_2$ laser source 82 into the reaction chamber 46 and the substrate 48 is irradiated with the excimer laser beam 122.

The film forming gas comprising a mixture of $SiH_4$, $CH_4$, $GeH_4$ and $H_2$ in the reaction chamber 46 is converted into a gaseous plasma state upon excitation by the high frequency electric field exerted by the antenna 72. The excited species formed in the plasma, which include ions and partially decomposed molecules, reach the top of the substrate 48 and condense thereon to form a dense nc-SiCGe:H film. The plasma power density is set to be 0.01-3 W/cm$^3$, preferably 0.02-1 W/cm$^3$. The plasma power density is a value of the power applied from the antenna power supply 74 to the antenna 72 for plasma generation divided by the volume of plasma generation region in the reaction chamber 46, which approximately corresponds to the cylindrical volume defined by the coil-shaped antenna 72.

The ions in the plasma are accelerated toward the substrate 48 by the electric field exerted by the bias electrode 50, thereby compacting the growing nc-SiCGe:H film. The bias voltage on the electrode 50 is applied by the RF power supply 78 in such a way that ions transported to the substrate surface would have energies less than a predetermined threshold energy (for instance, 16 eV for Si), beyond which the semiconductor film on the substrate 48 may be damaged by bombardment from high energy ions.

With the gas mixture of $SiH_4$, $CH_4$, $GeH_4$ and $H_2$ in the reaction chamber 46 being converted into a gaseous plasma state by the antenna 72, the laser sheet 84 which passes atop of the substrate 48 concurrently excites and decomposes $SiH_4$, $CH_4$ and $GeH_4$ gas molecules along its path in the chamber 46. The decomposed and partially decomposed molecules arrive on the substrate surface by diffusion and condense thereon to form a film. At the same time, the substrate surface is irradiated with the excimer laser beam 122 with a power density of 1-15 mW/cm$^2$, which further decomposes film forming molecules on the substrate surface and enhances film forming reactions thereon. The film forming process is carried out until a desired nc-SiCGe:H thickness of 1-30 μm is reached.

Figure 6:
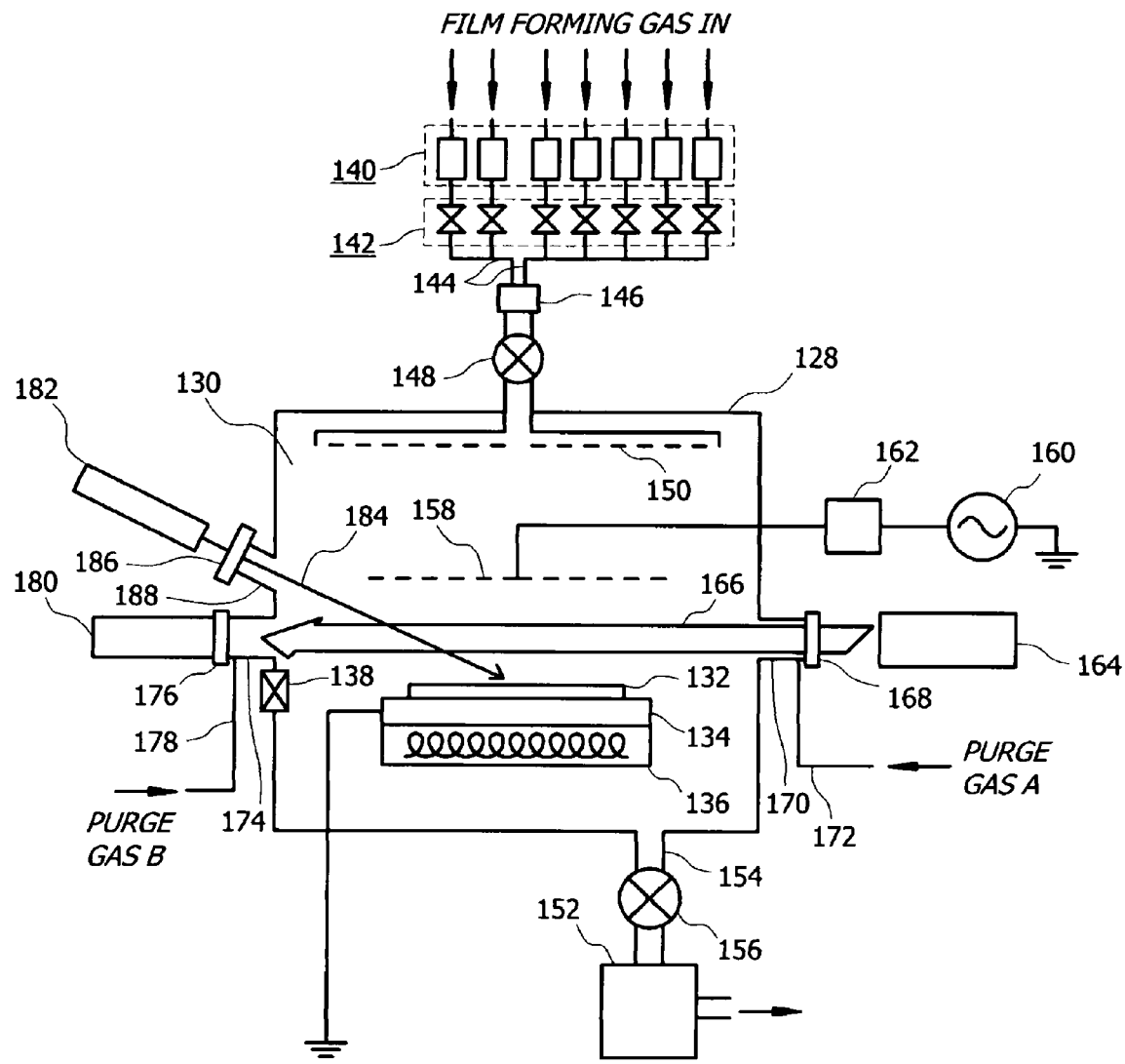
FIG. 6 is a schematic view of a high-rate CVD apparatus in accordance with a fourth embodiment of the present invention.

FIG. 6 shows a high-rate CVD apparatus in accordance with the fourth embodiment of the present invention. The illustrated apparatus has a reaction vessel 128 which defines a reaction chamber 130 therein. A generally flat substrate 132 for coating a film thereon is placed inside the reaction chamber 130. The substrate 132 is supported by a mounting base 134, preferably made of an electrically conducting metal. A suceptor 136 for heating the substrate 132 is attached to the bottom surface of the mounting base 134, and incorporates therein a heating element which may be energized from a current source (not shown) external to the chamber 130. The substrate 132 is transported in and out of the chamber 130 through a shutter 138 disposed on the sidewall of the vessel 128.

Gases from a plurality of external gas sources for forming semiconductor films, such as $SiH_4$, $GeH_4$, $CH_4$, $C_3H_8$, $H_2$, $B_2H_6$ and $PH_3$, are controlled by a set of corresponding MFCs 140 and control valves 142, and pass through gas delivery lines 144 (only some of which are shown) to a gas mixer 146. The resulting film forming gas in the mixer 146 passes through an inlet valve 148 and is introduced into the chamber 130 via a gas shower head 150 which is disposed on top of the chamber 128. The gas shower head 150 has a plurality of holes or openings distributed over the bottom surface thereof, such that the film forming gas passes therethrough is uniformly distributed in the chamber 130. The post-reaction gas in the chamber 130 is removed by a pumping system 152 through an output port 154 which is connected to a throttling valve 156 for controlling the chamber pressure.

A planar discharge electrode 158 is disposed on top of the substrate 132 and is generally parallel to the same for generating a plasma by ionization of the film forming gas in the chamber 130. The discharge electrode 158, which is made from a conductive metal, is shown as being in the form of screen or mesh, although other configurations such as a solid plate type of construction can also be employed. The mounting base 134, which is grounded, acts as the complimentary ground electrode to the discharge electrode 158. A RF power supply 160, preferably having an operating frequency of 13.56 to 108.48 MHz, provides energy to the discharge electrode 158 through an impedance matching network 162 which is tuned to the impedance of the plasma generated in between the electrodes 158 and 134 as well known to one of skill in the art.

A high-power $CO_2$ laser source 164 disposed outside the reaction chamber 130 is used to emit a laser sheet 166 for exciting and decomposing the film forming gas in the chamber 130. Other types of gas lasers such as excimer laser, ArF laser, KrCl laser, KrF laser, XeCl laser and XeF laser may also be used to emit the laser sheet 166. The $CO_2$ laser source 164 may be constructed according to the examples shown in FIGS. 3A and 3B.

Referring again to FIG. 6, the laser sheet 166 is transmitted into the reaction chamber 130 through a laser incidence window 168 attached to a laser incidence port 170 which is disposed on the side of the vessel 128. The incidence window 168 is constructed of a suitably rigid and light transparent material such as quartz. A purge gas A, preferably an inert gas such as Ar, He, Xe or Kr, is introduced into the cavity of the incidence port 170 via a purge gas delivery line 172, thereby flushing out the film forming gas therein and preventing the clouding of the laser incidence window 168 attached thereto. The cavity opening of the incidence port 170 to the reaction chamber 130 in the direction perpendicular to the laser sheet 166 should be sufficiently narrow, preferably less than 5 mm, and the length of the cavity of the incidence port 170 in the propagation direction of the laser sheet 166 should be sufficiently long, preferably longer than 100 mm, thereby preventing the film forming gas in the reaction chamber 130 from reaching the surface of the incidence window 168 by diffusion.

The laser sheet 166 passes inside the chamber 130 in between the discharge electrode 158 and the substrate 132 on a plane which is substantially parallel to the top surface of the substrate 132 and is spaced apart therefrom by a few millimeters. The laser sheet 166 should be wider than the substrate 132 in the direction orthogonal to the propagation direction of the same, thereby allowing excitation and decomposition of the film forming gas to occur uniformly over the substrate 132. The laser sheet 166 exits the chamber 130 through a laser emergence port 174 disposed on the vessel 128 opposite to the incidence port 168 and a transparent laser emergence window 176 attached thereto. A purge gas B, preferably an inert gas such as Ar, He, Xe or Kr, is introduced into the cavity of the emergence port 174 via a purge gas delivery line 178, thereby removing the film forming gas therein and preventing the clouding of the laser emergence window 176 attached thereto. A laser termination unit 180 is attached to the laser emergence window 176 for receiving the laser sheet 166 emerged from the same. The termination unit 180 includes a power detector (not shown) for measuring the amount of photon energy absorbed by the film forming gas and a plurality of optical lenses and reflective mirrors (not shown) for reflecting the laser sheet 166 back to the reaction chamber 130, thereby further enhancing the excitation and decomposition of the film forming gas therein. The above-mentioned laser termination unit 180 may also be replaced by a laser trap made of a light absorbing material such as carbon for absorbing the laser sheet 166 which has emerged from the emergence window 176.

An excimer laser source 182 is disposed outside the chamber 130 for crystallizing a film by irradiating the same on the substrate 132 with a laser beam 184, which passes into the reaction chamber 130 through a light-transparent window 186 attached to a peripheral port 188 on the reaction vessel 128. The excimer laser source 182 is positioned in such a way that allows the laser beam 184 to irradiate the top surface of the substrate 132 in the chamber 130.

Operation of the illustrated apparatus of FIG. 6 will now be described for forming a nc-SiC:H film on the substrate 132. The reaction chamber 130 is first evacuated to $10^{-6}$-$10^{-8}$ Torr by the pumping system 152. With the substrate 132 placed on the mounting base 134 in the reaction chamber 130, the suceptor 136 is used to heat the substrate 132 to 150-550° C., preferably 300-500° C. When the desired substrate temperature is reached, a film forming gas comprising a mixture of $SiH_4$, $CH_4$ and $H_2$ is introduced at a predetermined flow rate into the reaction chamber 130 through the gas shower head 150. The pressure of the film forming gas in the chamber 130 is maintained at $10^{-2}$ to 1 Torr, preferably $10^{-1}$ to 1 Torr. The high frequency power is then provided to the discharge electrode 158 by the power supply 160, and at the same time a laser sheet 166 is emitted from the $CO_2$ laser source 164 into the reaction chamber 130.

The film forming gas between the discharge electrode 158 and the ground electrode 134 is converted into a gaseous plasma state upon excitation by the discharge electrode 158. The excited species formed in the plasma, which include ions and partially decomposed molecules, reach the top of the substrate 132 and condense thereon to form a dense nc-SiC:H film. The plasma power density is set to be 0.01-3 $W/cm^3$, preferably 0.02-1 $W/cm^3$. The plasma power density is a value of the power applied from the power supply 160 to the discharge electrode 158 for plasma generation divided by the volume of plasma generation region, which approximately corresponds to the volume in between the discharge electrode 158 and the ground electrode 134.

With a plasma being generated between the electrodes 134 and 158 by ionization of the film forming gas, the laser sheet 166 which passes atop of the substrate 132 concurrently excites and decomposes $SiH_4$ and $CH_4$ molecules in the forming gas along the path thereof in the chamber 130. Under high-rate deposition conditions, such as high laser power and high gas flow rate, exothermic reactions can occur to form discrete nc-SiC:H nanoparticles in the gas phase, thereby depositing the same directly on the substrate 132. The simultaneous deposition of discrete nanoparticles on the substrate 132 by the laser-induced reactions and condensed vapors from the plasma permits the condensation of the excited species from the plasma to fill the gaps between nanoparticles, thereby forming a non-porous nc-SiC:H film with nanoparticles imbedded in a dense matrix.

After the nc-SiC:H film is formed according to the procedures described above, all power to the discharge electrode 158 and the $CO_2$ laser 164 for emitting the laser sheet 166 is terminated. The inlet gas valve 148 is closed and the film forming gas in the chamber 130 is evacuated by the pumping system 152, thereby forming a vacuum therein. Under the above state, power is provided to the excimer laser source 182 for generating the laser beam 184 with a power density of 1-15 $mW/cm^2$ to irradiate the as-deposited nc-SiC:H film on top of the substrate 132, thereby further improving the film crystallinity and electrical properties thereof.

Figure 7:
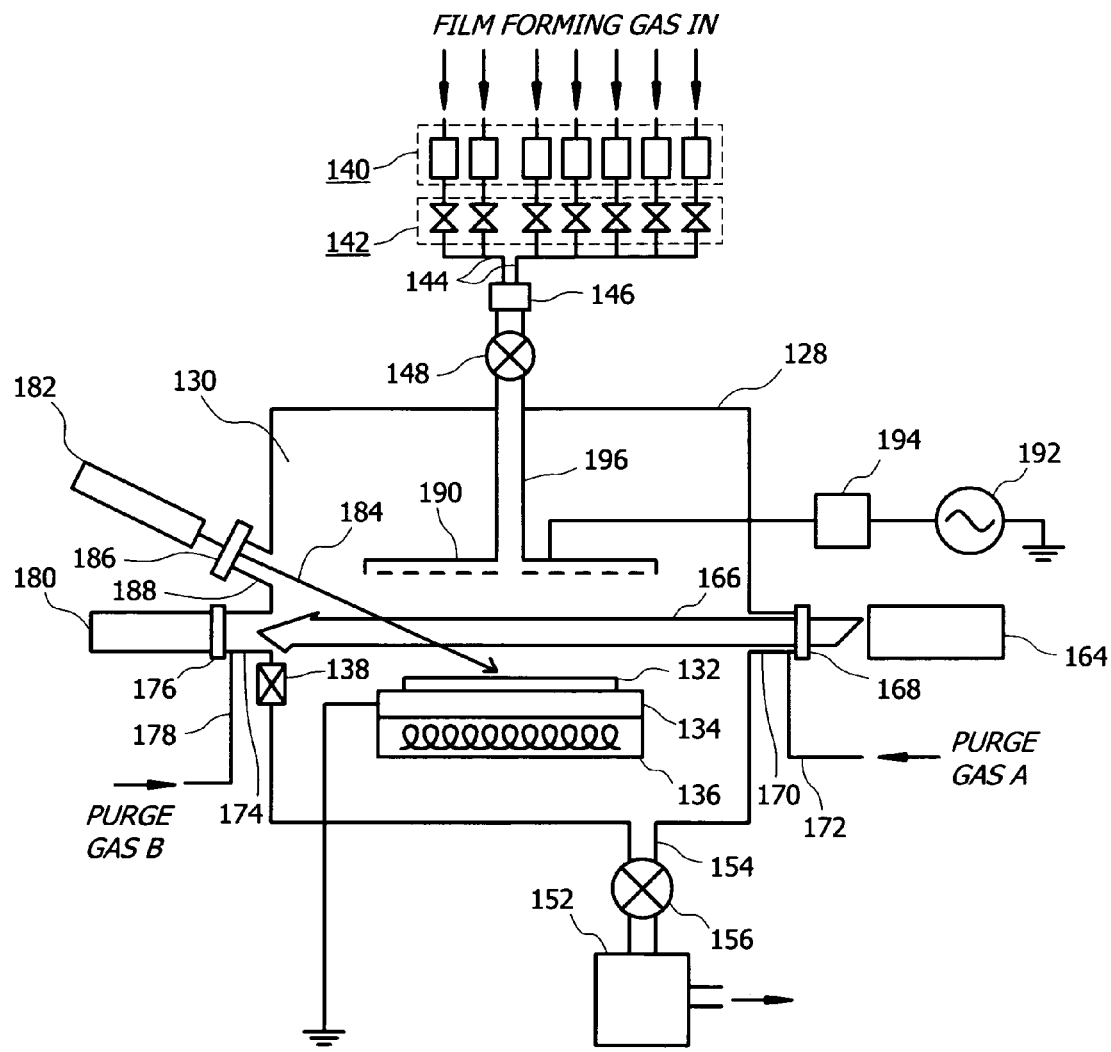
FIG. 7 is a schematic view of a high-rate CVD apparatus in accordance with a fifth embodiment of the present invention.

FIG. 7 is a schematic view showing a high-rate CVD apparatus for forming semiconductor films according to the fifth embodiment of the present invention. In the drawing, numerals 128 to 188 denote the same components or substances as those shown for the fourth embodiment in FIG. 6. The CVD apparatus of the fifth embodiment shown in FIG. 7 is different from the CVD apparatus of the fourth embodiment in that the planar discharge electrode 158 in FIG. 6 is replaced by a gas shower head 190, which also acts as a discharge electrode connected to a RF power supply 192 via a matching network 194. The gas shower head 190 is made of an electrically conducting metal and has a plurality of holes or openings distributed over the bottom surface thereof, such that the film forming gas passes therethrough is uniformly distributed over the top of the substrate 132. A gas delivery line 196, which is made of an electrically insulating material, physically connects the gas shower head 190 and the inlet valve 148, thereby electrically insulating the gas shower head 190 from the reaction vessel 128.

The operation of the apparatus according to the fifth embodiment in FIG. 7 is different from that of the apparatus of the fourth embodiment (FIG. 6) described above in that the gas shower head 190 is used both for introducing the film forming gas into the chamber 130 and for generating a plasma between the shower head 190 and the ground electrode 134 by ionization of the film forming gas. When the film forming gas is introduced into the chamber 130 through the gas shower head 190, high frequency power with an excitation frequency of 13.56 to 108.48 MHz is provided to the shower head 190 by the RF power supply 192 for generating a plasma between the ground electrode 134 and the same. At the same time, the laser sheet 166, which passes between the shower head 190 and the substrate 132, excites and decomposes the film forming gas along its path in the chamber 130. The placement of the gas shower head 190 directly above the substrate 132 allows the film forming gas to be delivered to the surface of the substrate 132 in a more uniform manner, thereby further improving the film uniformity on the substrate surface.

While the present invention has been shown and described with reference to certain preferred embodiments, it is to be understood that those skilled in the art will no doubt devise certain alterations and modifications thereto which nevertheless include the true spirit and scope of the present invention. For example, $SiH_4$ in the film forming gas can be substituted by another Si-contained gas such as $Si_2H_6$, $Si_3H_8$, $SiF_4$, $SiCl_4$, $SiH_3CH_3$, $Si_2(CH_3)_6$, $HSiCl_3$ and $H_2SiCl_2$. Methane ($CH_4$) in the film forming gas can be substituted by another C-contained gas such as $C_2H_2$, $C_2H_4$, $C_2H_6$, $C_3H_6$ and $C_3H_8$. Germaine ($GeH_4$) in the film forming gas can be substituted by another Ge-contained gas such as $GeH_3CH_3$ and $GeH_2(CH_3)_2$. Thus the scope of the invention should be determined by the appended claims and their legal equivalents, rather than by examples given.

What is claimed is:

1. A method for forming a semiconductor film on a substrate comprising the steps of:
   supporting said substrate in a reaction chamber;
   introducing a film forming gas into said reaction chamber; and
   generating a plasma in said reaction chamber by ionizing said film forming gas for
      decomposing said film forming gas while simultaneously emitting a laser sheet into said reaction chamber through an incidence window for decomposing said film forming gas, thereby forming a film on said substrate, wherein said laser sheet passes in parallel with said substrate along a plane spaced apart therefrom.

2. The method of claim 1 further comprising the step of applying a bias voltage to said substrate such that ions in said plasma would arrive on the substrate surface with energy not more than 16 eV.

3. The method of claim 1 wherein said semiconductor film is either a-Si:H or nc-Si:H.

4. The method of claim 1 wherein said semiconductor film is either a-SiC:H or nc-SiC:H.

5. The method of claim 1 wherein said semiconductor film is either a-SiGe:H or nc-SiGe:H.

6. The method of claim 1 wherein said semiconductor film comprises a plurality of nc-SiC:H/nc-SiGe:H bilayers.

7. The method of claim 1 wherein a thickness of said semiconductor film is not less than 1 μm and not more than 30 μm.

8. The method of claim 1 wherein said film forming gas comprises $H_2$ and a silicon-contained gas as selected from the group consisting of $SiH_4$, $Si_2H_6$, $Si_3H_8$, $SiF_4$, $SiCl_4$, $SiH_3CH_3$, $Si_2(CH_3)_6$, $HSiCl_3$ and $H_2SiCl_2$.

9. The method of claim 8 wherein said film forming gas further comprises a carbon-contained gas selected from the group consisting of $CH_4$, $C_2H_2$, $C_2H_4$, $C_2H_6$, $C_3H_6$ and $C_3H_8$.

10. The method of claim 8 wherein said film forming gas further comprises a germanium-contained gas selected from the group consisting of $GeH_4$, $GeH_3CH_3$ and $GeH_2(CH_3)_2$.

11. The method of claim 1 wherein the temperature of said substrate is set to be 150 to 600° C.

12. The method of claim 1 wherein an inert gas is blown against said incidence window for preventing clouding of said incidence window during film formation.

13. The method of claim 1 wherein said film is irradiated by a laser beam emitted by a second laser disposed outside said reaction chamber.

14. The method of claim 1 wherein said plasma is generated by an antenna disposed outside said reaction chamber, said antenna is powered by a power supply having an excitation frequency in the range of about 1 to about 27.12 MHz.

15. The method of claim 14 wherein the pressure in said reaction chamber is set to be $10^{-2}$ to 1 Torr.

16. The method of claim 14 wherein the plasma power density is set to be 0.01 to 3 $W/cm^3$.

17. The method of claim 1 wherein said plasma is generated between a planar discharge electrode powered by a power supply having an excitation frequency in the range of about 13.56 to about 108.48 MHz and a planar ground electrode electrically connect to said substrate, said discharge electrode is disposed in parallel with said ground electrode.

18. The method of claim 17 wherein the pressure in said reaction chamber is set to be $10^{-1}$ to 10 Torr.

19. The method of claim 17 wherein a plasma power density is set to be 0.01 to 3 $W/cm^3$.

20. A method for forming a SiCGe semiconductor film on a substrate comprising the steps of:
   supporting said substrate in a reaction chamber;
   heating said substrate to about 300 to 500° C.;
   introducing a film forming gas comprising a mixture of $SiH_4$, $GeH_4$, $CH_4$ and $H_2$ into said reaction chamber; and
   generating a plasma in said reaction chamber by ionizing said film forming gas for decomposing said film forming gas while simultaneously emitting a laser sheet into said reaction chamber through an incidence window for decomposing said film forming gas and irradiating the substrate surface with an excimer laser beam, thereby forming a film on said substrate, wherein said laser sheet passes in parallel with said substrate along a plane spaced apart therefrom, the power density of said excimer laser beam is in the range of 1 to 15 $mW/cm^2$.

* * * * *